(12) United States Patent
Smeets

(10) Patent No.: US 8,570,490 B2
(45) Date of Patent: Oct. 29, 2013

(54) LITHOGRAPHIC APPARATUS AND CONTROL METHOD

(75) Inventor: Benjamin Cunnegonda Henricus Smeets, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 651 days.

(21) Appl. No.: 12/627,097

(22) Filed: Nov. 30, 2009

(65) Prior Publication Data

US 2010/0157272 A1 Jun. 24, 2010

Related U.S. Application Data

(60) Provisional application No. 61/139,934, filed on Dec. 22, 2008.

(51) Int. Cl.
*G03B 27/58* (2006.01)

(52) U.S. Cl.
USPC .......................................................... 355/72

(58) Field of Classification Search
USPC .......................................... 355/72, 75, 77, 53
See application file for complete search history.

(56) References Cited

U.S. PATENT DOCUMENTS

| | | | |
|---|---|---|---|
| 6,195,155 B1 | 2/2001 | Kawai | |
| 7,227,614 B2 * | 6/2007 | Butler et al. | 355/53 |
| 2007/0182944 A1 * | 8/2007 | Van De Biggelaar | 355/53 |
| 2008/0246934 A1 * | 10/2008 | Van Den Biggelaar | 355/53 |
| 2009/0091725 A1 * | 4/2009 | Van Der Wijst et al. | 355/53 |

FOREIGN PATENT DOCUMENTS

| | | |
|---|---|---|
| JP | 9-106939 | 4/1997 |
| JP | 09-289147 | 11/1997 |
| JP | 10-083953 | 3/1998 |
| JP | 11-233433 | 8/1999 |
| JP | 2003-059806 | 2/2003 |
| JP | 2004-158689 | 6/2004 |
| JP | 2004-319780 | 11/2004 |
| JP | 2005-123220 | 5/2005 |

OTHER PUBLICATIONS

Japanese Office Action dated Feb. 3, 2012 in corresponding Japanese Patent Application No. 2009-279992.

* cited by examiner

*Primary Examiner* — Glen Kao
(74) *Attorney, Agent, or Firm* — Pillsbury Winthrop Shaw Pittman LLP

(57) ABSTRACT

A method includes providing a controller to control a speed of a substrate table in a scan direction, the controller including a first input to receive a first signal representative of a first time period of a movement of the substrate table in a step direction, a second input to receive a second signal representative of a distance in the scan direction to be covered by the substrate table during a scan movement thereof, and a third input to receive a third signal representative of an acceleration of the substrate table. The controller includes an output to provide an output signal to control the speed of the substrate table in the scan direction. The method includes calculating the speed of the substrate table in the scan direction from the first, second and third signal, and compensating the output signal for the calculated speed of the substrate table.

10 Claims, 4 Drawing Sheets

LITHOGRAPHIC APPARATUS AND CONTROL METHOD

CROSS REFERENCE TO RELATED APPLICATIONS

This application claims priority and benefit under 35 U.S.C. §119(e) to U.S. Provisional Patent Application No. 61/139,934, entitled "Lithographic Apparatus and Control Method", filed on Dec. 22, 2008. The content of that application is incorporated herein in its entirety by reference.

FIELD

The present invention relates to a lithographic apparatus. In particular, the present invention relates to a method of controlling a lithographic apparatus and a lithographic apparatus including a control unit arranged to control such a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanner, or scanning lithographic apparatus, the apparatus includes a substrate or wafer table that is constructed to hold a substrate, e.g. a resist-coated wafer. During exposure of the substrate, the substrate table is moved in a scan direction (usually denoted as Y-direction) with respect to a projection system, such as a lens assembly that is configured to project a pattern imparted to a radiation beam by a patterning device such as a mask onto a target portion on the substrate. During this scanning motion, or scan movement, the speed of the substrate in the scan direction is kept constant. The speed of the substrate during the scan movement is not arbitrary. On the one hand the speed of the substrate, i.e. the speed of the substrate table, is limited due to the mechanical properties of the lithographic apparatus for example, on the other hand it is desirable to optimize the speed of the substrate during scanning to expose the substrate as fast as possible.

The usual way of determining this optimized scan speed is to minimize the time required to cover the distance to be traveled during the scan movement, i.e. the distance in the scan direction. This optimization of the scan speed takes into account this distance, which is equal to the size of the target portion in the scan direction including the slit size, i.e. the distance between two neighboring target portions. Further, the acceleration of the substrate in the scan direction is taken into account in the determination of the optimized scan speed. This way of determining the optimized scan speed has been used in lithography for many years.

SUMMARY

In the field of lithography and in particular in the field of IC manufacturing it is desirable to further increase the productivity of the lithography apparatus. An increase in the productivity in this context is often referred to as an increase in the so-called throughput, which is ordinarily defined as a number of exposed substrates per hour. The inventors have realized that a further increase in the throughput of a scanner-type lithographic apparatus can be achieved. In particular, the inventors have realized that the way in which the optimized scan speed is normally determined does not take into account all the circumstances that play a role in the scan speed that can be applied in a lithographic apparatus. In particular, the inventors have realized that in a scanner type lithographic apparatus the time required to make a so-called step movement to a subsequent target portion or die on the substrate that is to be exposed (usually denoted as X-direction, which is perpendicular to the scan direction or Y-direction) may in some circumstances be longer then the time required to reverse the speed of the substrate table in scan direction so that the next target portion can be scanned. In practice this means, that in such a situation the substrate table will be waiting during a time period which is equal to the difference between the time periods, i.e. when the time required to perform a step movement in the X direction is longer that the time required to reverse the scan speed in the Y direction.

The inventors have had the insight that this additional time, that is available when the step in X direction takes longer than reversing the speed of the substrate table in Y direction, i.e. the lithographic apparatus is a so-called X limited system, can be used to accelerate the substrate table that carries the substrate further so as to achieve a scan speed that is higher than the optimized scan speed as mentioned above. In other words, the inventors have realized that the traditional way in which the optimized scan speed is determined does not take into account the time required to perform a step movement in the X direction and consequently that a sub-optimal scan speed is actually obtained in situations where the step movement in X direction takes a relatively long time compared to the time required to reverse the speed of the substrate table in the scan direction.

According to a first aspect of the invention, there is provided a lithographic apparatus, including a substrate table constructed to hold a substrate, and being connected to a positioning device configured to move the substrate table in a scan direction and in a step direction, and a controller arranged to control a speed ($V_{scan}$) of the substrate table in at least the scan direction during operation, the controller including a first input configured to receive a first signal representative of a first time period ($T_{step}$) of a movement of the substrate table in the step direction, a second input configured to receive a second signal representative of a distance ($d_{scan}$) in the scan direction to be covered by the substrate table during a scan movement thereof, a third input configured to receive a third signal representative of an acceleration ($a_{scan}$) of the substrate table in the scan direction, and an output configured to provide an output signal to control the speed ($V_{scan}$) of the substrate table in the scan direction, wherein the controller is further arranged to calculate the speed ($V_{scan}$) of the substrate table in the scan direction from the first ($T_{step}$), second ($d_{scan}$) and third signal ($a_{scan}$), and to compensate the output signal for the calculated speed ($V_{scan}$) of the substrate table.

According to an embodiment the control unit includes a fourth input configured to receive a fourth signal representative of a jerk ($j_{scan}$) of the substrate table in the scan direction, and is further arranged to calculate the speed ($V_{scan}$) of the substrate table in the scan direction from the first, second, third and fourth signal ($j_{scan}$).

According to a further embodiment the control unit is further arranged to calculate a nominal speed ($V_{nom\_scan}$) of the substrate table in the scan direction from the second and third signal, to determine whether the calculated nominal speed ($V_{nom\_scan}$) exceeds the calculated speed ($V_{scan}$) of the substrate table, and to compensate the output signal for the calculated nominal speed ($V_{nom\_scan}$) when the calculated nominal speed ($V_{nom\_scan}$) exceeds the calculated speed ($V_{scan}$) of the substrate table.

According to a further embodiment the controller is further arranged to determine whether the calculated speed ($V_{scan}$) of the substrate table exceeds an allowable speed ($V_{max}$) of the substrate table in the scan direction, and to compensate the output signal for the allowable speed ($V_{max}$) of the substrate table in the scan direction when the calculated speed ($V_{scan}$) of the substrate table exceeds the allowable speed ($V_{max}$).

According to a further embodiment the controller is further arranged to calculate a second time period ($T_{reverse}$) in which the speed ($V_{scan}$) of the substrate table can be reversed, to determine whether the second time ($T_{reverse}$) period is less than the first time period ($T_{step}$), and to compensate the output signal for the second time period when the second time period is less than the first time period.

In a further aspect of the invention, there is provided a method of controlling a lithographic apparatus including projecting a patterned beam of radiation onto a substrate, the method further including providing a controller arranged to control a speed ($V_{scan}$) of a substrate table in at least a scan direction during operation, the controller including a first input configured to receive a first signal representative of a first time period ($T_{step}$) of a movement of the substrate table in a step direction, a second input configured to receive a second signal representative of a distance ($d_{scan}$) in the scan direction to be covered by the substrate table during a scan movement thereof, a third input configured to receive a third signal representative of an acceleration ($a_{scan}$) of the substrate table, and an output configured to provide an output signal to control the speed ($V_{scan}$) of the substrate table in the scan direction, the method further including calculating the speed ($V_{scan}$) of the substrate table in the scan direction from the first ($T_{step}$), second ($d_{scan}$) and third signal ($a_{scan}$), and compensating the output signal for the calculated speed ($V_{scan}$) of the substrate table using the control device.

In an embodiment the controller further includes a fourth input configured to receive a fourth signal representative of a jerk ($j_{scan}$) of the substrate table in the scan direction, and wherein the method further includes calculating the speed ($V_{scan}$) of the substrate table in the scan direction from the first, second, third and fourth signal.

In an embodiment the method further includes calculating a nominal speed ($V_{nom\_scan}$) of the substrate table in the scan direction from the second and third signal, determining whether the calculated nominal speed ($V_{nom\_scan}$) exceeds the calculated speed ($V_{scan}$) of the substrate table, and compensating the output signal for the calculated nominal speed ($V_{nom\_scan}$) when the calculated nominal speed ($V_{nom\_scan}$) exceeds the calculated speed ($V_{scan}$) of the substrate table using the controller.

In an embodiment the method further includes determining whether the calculated speed ($V_{scan}$) of the substrate table exceeds an allowable speed ($V_{max}$) of the substrate table in the scan direction, and compensating the output signal for the allowable speed ($V_{max}$) of the substrate table in the scan direction when the calculated speed ($V_{scan}$) of the substrate table exceeds the allowable speed ($V_{max}$) using the controller.

In an embodiment, the method further includes calculating a second time period in which the speed ($V_{scan}$) of the substrate table can be reversed, determining whether the second time period is less than the first time period, and compensating the output signal for the second time period when the second time period is less than the first time period using the control unit.

In an embodiment the nominal speed ($V_{opt\_y}$) of the substrate table in the scan direction is calculated as:

$$V_{nom\_scan} = \sqrt{\frac{(d_{scan} \cdot a_{scan})}{2}}$$

In an embodiment the speed ($V_{scan}$) of the substrate table in the scan direction is calculated as:

$$V_{scan} = \frac{\left((a_{scan} \cdot T_{step}) - \left(\frac{a_{scan}^2}{j_{scan}}\right)\right)}{2}$$

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
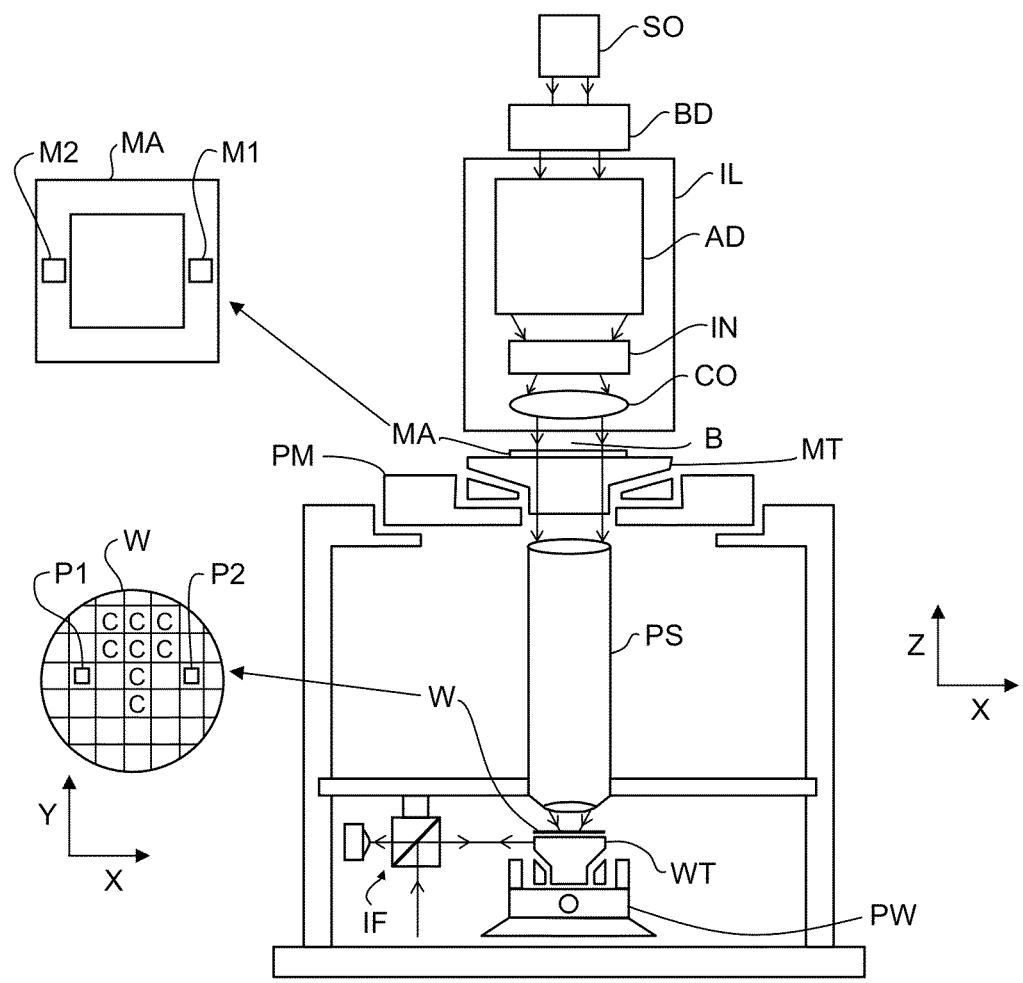
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
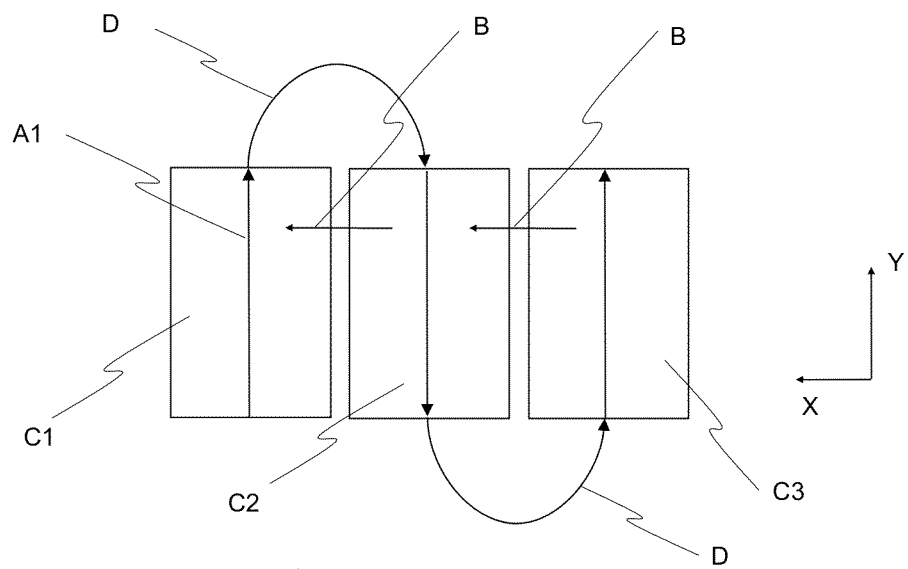
FIG. 2 depicts a schematic representation of a step and scan movement.

FIG. 2 schematically shows a conventional scanning exposure sequence for three adjacent dies or target portions C1-C3 which are located on a substrate or wafer W (not shown) as was discussed with reference to FIG. 1. In particular FIG. 2 shows an idealized exposure sequence wherein the scanning movement in Y direction of the substrate table WT (not shown) and the stepping movement thereof in X direction are synchronized.

Firstly, the die or target portion C1 shown in the left part of FIG. 2 is exposed and displaced by a scanning movement in the Y direction as indicated with arrow A1. As soon as the exposure of die C1 is finished, the substrate table carrying the substrate is moved or stepped in X direction (step direction) as indicated with arrow B in FIG. 2. While the substrate is moved in step direction the speed of the substrate in the Y or scan direction is reversed as indicated with arrow D, so that as soon as the next die C2 to be exposed is in its correct position under the projection system, die C2 can be exposed while scanningly moving is in the direction of arrow A2. Hence, dies C1 and C2 are scanned in opposite directions. As soon as the exposure of die C2 is finished, the same procedure is repeated and die C3 is stepped prior to exposure.

In the situation of FIG. 2, reversing the movement of the substrate after a completed scan of a die is depicted as a continuous movement. In other words, the scan speed of the substrate table is reversed from a speed $+V_{scan}$ to $-V_{scan}$ in the same time as it takes the substrate table to step towards the new position wherein the next die C can be exposed. It is noted that the same is true if it takes less time for the substrate table WT to step to its new position than to complete the reversal of the scan speed $V_{scan}$. Such lithographic systems are generally denoted as Y limited systems, because the time it takes to make a scan movement of such systems is greater than the time it takes to complete a step in the step direction.

Figure 3:
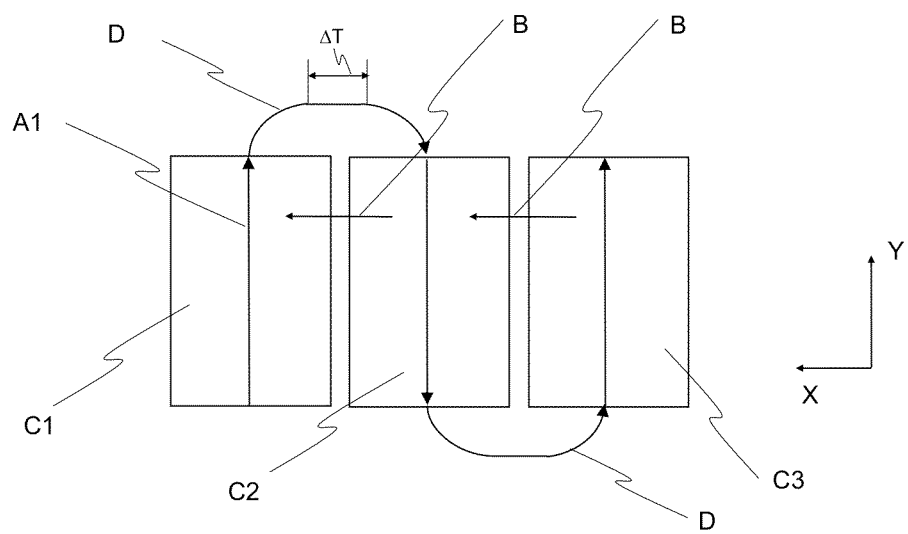
FIG. 3 depicts a schematic representation of a step and scan movement for an X limited lithographic apparatus.

Depending on the size of the dies C in the step direction (X), the time required to complete a step in step direction ($T_{step}$) may take longer than the time required ($T_{reverse}$) to reverse the scan speed $V_{scan}$. In particular for dies C that have relatively large dimensions in the step direction, the difference between $T_{step}$ and $T_{reverse}$ can be significant. Such systems are generally denoted as X limited systems, because the time it takes to make a scan movement of such systems is less than the time it takes to complete a step in the step direction. FIG. 3 schematically shows such a situation.

The step and scan procedure shown in FIG. 3 is the same as the one shown in FIG. 2, with the difference that the time $T_{step}$ that is required to make the step movement is longer than the time $T_{reverse}$ that is required to reverse the scan speed $V_{scan}$. This is depicted in FIG. 3 by the flattened shape of arrow D, which indicates that the substrate table is not moving, i.e. is waiting during a time period $\Delta T$ (schematically depicted in FIG. 3) before the substrate table can be accelerated again to achieve the required scan speed to complete the scanning exposure of the next die C.

The indicated time period $\Delta T$, i.e. the positive difference between the time $T_{step}$ that is required to make the step movement and the time $T_{reverse}$ that is required to reverse the scan speed $V_{scan}$ is time in which the substrate table WT is idle. The effect thereof can be visualized by looking at the acceleration profile and the velocity profile of the substrate table during reversal of the scan speed $V_{scan}$. These are provided in FIGS. 4A and 4B.

Figure 4A:
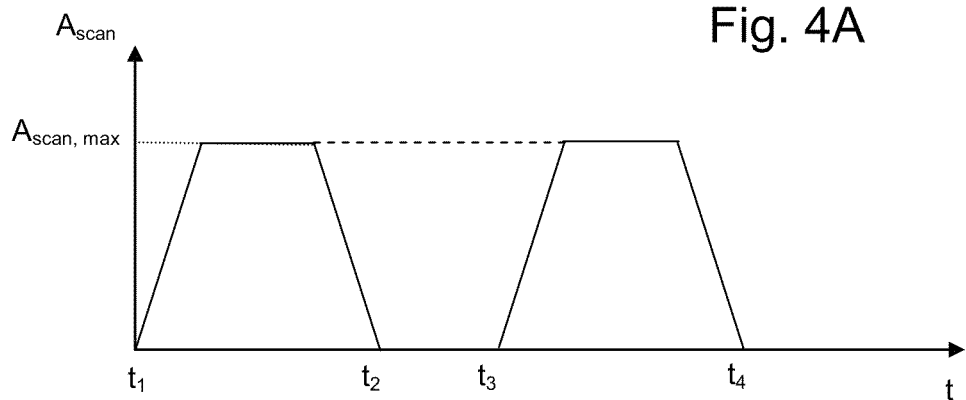
FIG. 4A depicts a diagram of an acceleration profile of a substrate table.
Figure 4B:
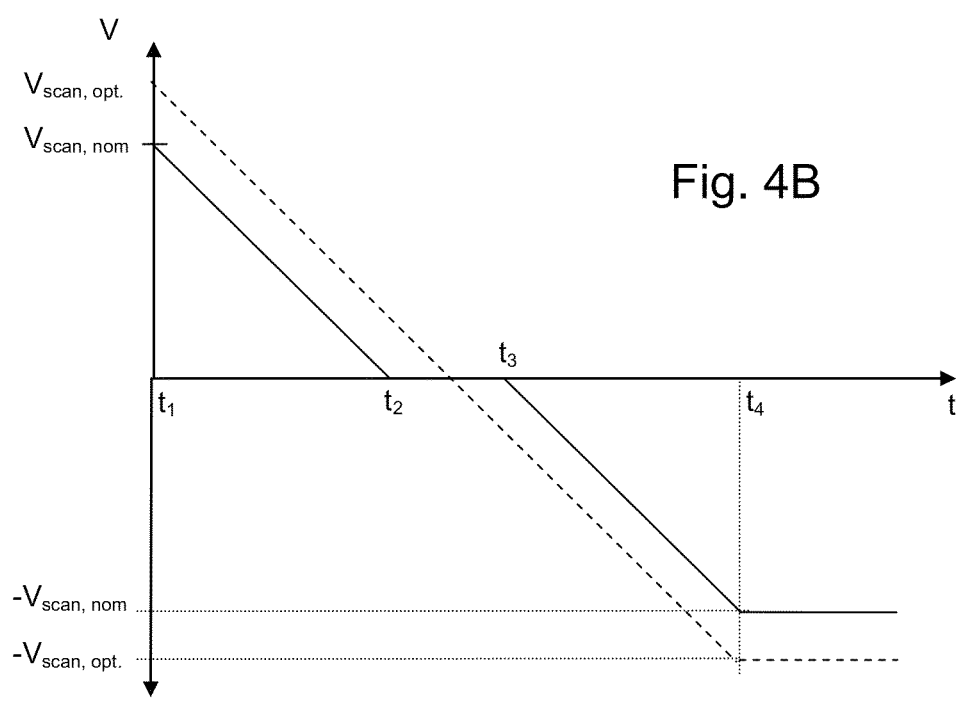
FIG. 4B depicts a diagram of a velocity profile of a substrate table.

FIG. 4A shows a diagram in which an acceleration profile is given that is applied when reversing the scan speed of the substrate table WT. FIG. 4B shows a diagram in which a velocity profile is given that is the result of the acceleration profile of FIG. 4A.

At the horizontal axis of FIGS. 4A and 4B the time is located, the vertical axis is the applied acceleration $a_{scan}$ respectively the speed $V_{scan}$. First the situation is described wherein the time required to perform a step movement by the substrate table takes longer than the time that is required to perform a reversal of the speed of the substrate table. This is depicted in FIGS. 4A and 4B by means of solid lines.

At $t=t_1$ the scan movement during which a die was exposed has just finished and the speed of the substrate table equals $V_{scan, nom}$ the determination and meaning of which will be explained below. In order to reverse this scan speed $V_{scan, nom}$, the substrate table is slowed down or decelerated from $t=t_1$ to $t=t_2$ such that the speed of the substrate table at $t=t_2$ is zero. Between $t=t_2$ to $t=t_3$ the substrate table is idle as was explained above and is waiting for the step movement to be completed. It is noted however that it is also possible to reduce the acceleration such, that the same result is achieved. This means that a lower acceleration than $a_{scan, max}$ is applied. In principle this corresponds to an 'idle' period. At $t=t_3$ the substrate table is accelerated in the reverse direction, hence the same sign of the acceleration $a_{scan}$, so that at $t=t_4$ the scan speed of the substrate table is reversed and equals $-V_{scan, nom}$.

As can be seen in FIG. 4A, the acceleration $a_y$ has a maximum value $a_{scan, max}$. This maximum value of the acceleration is dependent on the power of the drive motors for example, the maximum acceleration that the substrate can withstand and the amount of heat that can be handled by the cooling systems for example.

The speed $V_{scan, nom}$ with which the substrate table WT is moved during the scan movement thereof without the application of the invention as will be explained in more detail below, is hereinafter denoted as the nominal scan speed, and is calculated as $$V_{scan\_nom} = \sqrt{\frac{(d_{scan} \cdot a_{scan})}{2}} \quad \text{(Formula I)}$$

wherein $d_{scan}$ equals the distance in meters that has to be traveled by the substrate table during the scan movement. This distance equals the size of the die in scan direction plus the size of a slit between two adjacent dies. This calculation of the scan speed does not take into account the idle period in systems that are X limited.

Looking at FIG. 4B, it is visible that between $t=t_2$ and $t=t_3$ the substrate table is idle. The idle period of time can be used to increase the speed of the substrate table during scan movement thereof, whereby this higher or optimized scan speed $V_{scan, opt}$ is calculated such, that the substrate table will not experience an idle period in the scan direction while it is performing a step movement. In practice this means that between $t=t_1$ and $t=t_4$ the substrate table will be subjected to a constant acceleration, indicated in FIG. 4A by means of a dotted line. This will result in a higher scan speed $V_{scan, opt}$ as is shown by means of a dotted line in FIG. 4B. As can be seen in FIG. 4B, the slope of the velocity profile is the same for both situations, as the applied level of acceleration ($a_{scan, max}$) has not changed.

It will be clear that the use of a higher scan speed to perform the scanning exposure of a die or target portion will result in the scanning exposure to be completed in less time than when using the more conservative nominal scan speed. Hence, realizing that the time required to perform a step movement in the determination of the optimal scan speed will allow for higher scan speeds to be applied.

Knowing the time $T_{step}$ required to perform the step movement, the optimal scan speed taking into account this time can be calculated as $$V_{scan,opt} = \frac{\left((a_{scan} \cdot T_{step}) - \left(\frac{a_{scan}^2}{j_{scan}}\right)\right)}{2} \quad \text{(Formula II)}$$

wherein, $j_{scan}$ is the jerk in m/s$^3$. The jerk is associated with the drive motor that moves the substrate table and reflects the physical effect that it is in practice not possible to instantaneously apply the required acceleration.

The application of the above method of determining the optimal scan speed can in practice be implemented by providing the lithographic apparatus with a controller or control unit that is arranged to control the speed $V_{scan}$ of the substrate table in at least the scan direction during operation. Such a controller may include a first input configured to receive a first signal representative of a first time period, i.e. $T_{step}$, of a movement of the substrate table in the step direction, a second input configured to receive a second signal representative of a distance, i.e. $d_{scan}$, in the scan direction to be covered by the substrate table during a scan movement thereof and a third input configured to receive a third signal representative of an acceleration, i.e. $a_{scan}$, of the substrate table in the scan direction. The controller may further include an output configured to provide an output signal to control the speed $V_{scan}$ of the substrate table in the scan direction, wherein the controller is further arranged to calculate the optimal speed $V_{scan, opt}$ of the substrate table in the scan direction from the first ($T_{step}$), second ($d_{scan}$) and third signal ($a_{scan}$), and to compensate the output signal for the calculated speed of the substrate table.

As indicated above, the calculation method also takes into account the jerk $j_{scan}$ and consequently the control unit may also include a fourth input configured to receive a fourth signal representative of the jerk, i.e. $j_{scan}$ of the substrate table in the scan direction, and is further arranged to calculate the speed of the substrate table in the scan direction from the first, second, third and fourth signal $j_{scan}$ scan as indicated with formula II.

The method of calculating the optimal scan speed of the substrate table can be implemented in software that is loaded in the memory of a computer. However, it may also be implemented in the hardware of the control unit.

It is noted that the control unit may further be arranged to determine whether or not the calculated nominal speed $V_{scan, nom}$ of the substrate table in the scan direction is equal or exceeds the calculated optimal speed $V_{scan, opt}$ of the substrate table. In case that is so, the nominal speed will be the highest speed. The control unit will in such a case compensate the output signal for the calculated nominal speed $V_{scan, nom}$. This means that the optimal scan speed applied will be equal to the calculated nominal speed $V_{scan, nom}$ in cases where the calculated optimal speed $V_{scan, opt}$ gives the lower value of the scan speed.

The control unit may further arranged to determine whether the calculated optimal speed of the substrate table exceeds an allowable speed $V_{max}$ of the substrate table in the scan direction, and to compensate the output signal for the allowable speed $V_{max}$ of the substrate table in the scan direction when the calculated optimal speed $V_{scan}$ of the substrate table exceeds the allowable speed $V_{max}$. The maximum allowable speed $V_{max}$ is to be observed because of the power of the radiation source, or laser, in order for the exposure to be done successfully. A too high speed will result in poor exposure results. This means that the maximum scan speed that can be applied is limited by this maximum allowable speed $V_{max}$.

Figure 5:
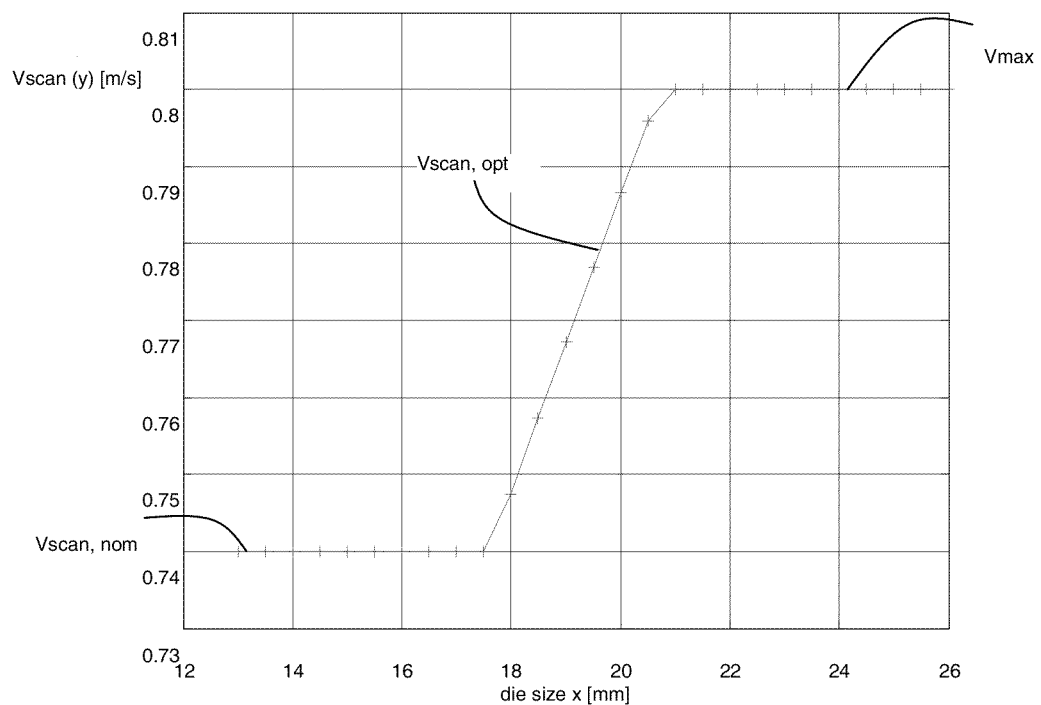
FIG. 5 depicts a diagram of a scan speed dependent on a die size in step direction.

With reference to FIG. 5, an embodiment of the invention will now be explained. In the example given, some parameters of the lithographic apparatus are fixed to show the effect of taking the time required for performing a movement in the step direction into account when determining the optimal scan speed.

In the following example the acceleration $a_y$ is taken as being 30 m/s$^2$, the jerk $j_y$ is taken as being 3300 m/s$^3$ and the slit size is taken as being 6.5 mm. The size of the die to be exposed in scan direction $d_y$ equals 30 mm.

Applying Formula I this yields a nominal scan speed $V_{scan,nom}$ of 0.74 m/s. For a regular lithographic apparatus a value for the allowable scan speed $V_{max}$ is about 0.8 m/s.

Applying Formula II and putting the results thereof for different sizes of dies in step direction is presented in FIG. 5 from which it can be seen that for the example used a die size in step direction (X) of more than about 17.5 mm will give rise to the possibility of increasing the scan speed. The maximum allowable scan speed of 0.8 m/s will only be reached for die sizes in step direction of more than 21 mm.

It is noted that the example shown in FIG. 5 is only of an exemplary nature and that very different parameter settings are possible. The example of FIG. 5 is purely provided to show how the invention can be applied and provides for an increased optimal scan speed when using the insight that for X limited systems the usual way of determining the optimal scan speed using Formula I gives results that may be too conservative in certain cases. By applying the higher scan speed more dies can be exposed in a certain time, thus increasing throughput of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table constructed to hold a substrate, the substrate table connected to a positioning device configured to move the substrate table in a scan direction and in a step direction; and
   a controller arranged to control a speed of the substrate table in at least the scan direction, the controller comprising:
   a first input configured to receive a first signal representative of a first time period ($T_{step}$) of a movement of the substrate table in the step direction,
   a second input configured to receive a second signal representative of a distance ($d_{scan}$) in the scan direction to be covered by the substrate table during a scan movement thereof,
   a third input configured to receive a third signal representative of an acceleration ($a_{scan}$) of the substrate table in the scan direction,
   a fourth input configured to receive a fourth signal representative of a jerk ($j_{scan}$) of the substrate table in the scan direction, and
   an output configured to provide an output signal to control the speed ($V_{scan}$) of the substrate table in the scan direction,
   wherein the controller is further arranged to
   calculate the speed ($V_{scan}$) of the substrate table in the scan direction from the first ($T_{step}$), the second ($d_{scan}$), the third signal ($a_{scan}$) and the fourth signal ($j_{scan}$), and
   compensate the output signal for the calculated speed ($V_{scan}$) of the substrate table.

2. The lithographic apparatus of claim 1, wherein the controller is further arranged to
   calculate a nominal speed ($V_{scan, nom}$) of the substrate table in the scan direction from the second and the third signal,
   determine whether the calculated nominal speed ($V_{scan, nom}$) exceeds the calculated speed ($V_{scan}$) of the substrate table, and
   compensate the output signal for the calculated nominal speed ($V_{scan, nom}$) when the calculated nominal speed ($V_{scan, nom}$) exceeds the calculated speed ($V_{scan}$) of the substrate table.

3. The lithographic apparatus of claim 1, wherein the controller is further arranged to
   determine whether the calculated speed ($V_{scan}$) of the substrate table exceeds an allowable speed ($V_{max}$) of the substrate table in the scan direction, and
   compensate the output signal for the allowable speed ($V_{max}$) of the substrate table in the scan direction when the calculated speed ($V_{scan}$) of the substrate table exceeds the allowable speed ($V_{max}$).

4. The lithographic apparatus of claim 1, wherein the controller is further arranged to
   calculate a second time period ($T_{reverse}$) in which the speed ($V_{scan}$) of the substrate table can be reversed,
   determine whether the second time ($T_{reverse}$) period is less than the first time period ($T_{step}$), and
   compensate the output signal for the second time period when the second time period is less than the first time period.

5. A method for controlling a lithographic apparatus, comprising:
   controlling a speed ($V_{scan}$) of a substrate table in at least a scan direction during operation, the controlling comprising:

receiving a first signal representative of a first time period ($T_{step}$) of a movement of the substrate table in a step direction, receiving a second signal representative of a distance ($d_{scan}$) in the scan direction to be covered by the substrate table during a scan movement thereof, receiving a third signal representative of an acceleration ($a_{scan}$) of the substrate table, receiving a fourth signal representative of a jerk ($j_{scan}$) of the substrate table in the scan direction, and providing an output signal to control the speed ($V_{scan}$) of the substrate table in the scan direction, calculating the speed ($V_{scan}$) of the substrate table in the scan direction from the first ($T_{step}$), the second ($d_{scan}$), the third signal ($a_{scan}$) and the fourth signal ($j_{scan}$); and compensating the output signal for the calculated speed ($V_{scan}$) of the substrate and substrate table using said controlling.

6. The method of claim 5, the method further comprising calculating a nominal speed ($V_{scan,\ nom}$) of the substrate table in the scan direction from the second and third signal;

determining whether the calculated nominal speed ($V_{scan,\ nom}$) exceeds the calculated speed ($V_{scan}$) of the substrate table; and compensating the output signal for the calculated nominal speed ($V_{scan,\ nom}$) when the calculated nominal speed ($V_{scan,\ nom}$) exceeds the calculated speed ($V_{scan}$) of the substrate table using the controlling.

7. The method of claim 6, wherein the nominal speed ($V_{scan,\ nom}$) of the substrate table in the scan direction is calculated as:

$$V_{scan\_nom} = \sqrt{\frac{(d_{scan} \cdot a_{scan})}{2}}.$$

8. The method of claim 5, the method further comprising determining whether the calculated speed ($V_{scan}$) of the substrate table exceeds an allowable speed ($V_{max}$) of the substrate table in the scan direction; and compensating the output signal for the allowable speed ($V_{max}$) of the substrate table in the scan direction when the calculated speed ($V_{scan}$) of the substrate table exceeds the allowable speed ($V_{max}$) using the controlling.

9. The method of claim 5, the method further comprising calculating a second time period in which the speed ($V_{scan}$) of the substrate table can be reversed;

determining whether the second time period is less than the first time period; and compensating the output signal for the second time period when the second time period is less than the first time period using the controlling.

10. The method of claim 5, wherein speed ($V_{scan}$) of the substrate table in the scan direction is calculated as:

$$V_{scan} = \frac{\left((a_{scan} \cdot T_{step}) - \left(\frac{a_{scan}^2}{j_{scan}}\right)\right)}{2}.$$

* * * * *